United States Patent
Caron et al.

(10) Patent No.: US 10,727,089 B2
(45) Date of Patent: Jul. 28, 2020

(54) SYSTEMS AND METHODS FOR SELECTIVELY ETCHING FILM

(71) Applicant: Lam Research Corporation, Fremont, CA (US)

(72) Inventors: James Eugene Caron, Tracy, CA (US); Ivelin Angelov, San Jose, CA (US); Joon Hong Park, Dublin, CA (US); Dengliang Yang, Union City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/426,241

(22) Filed: Feb. 7, 2017

(65) Prior Publication Data

US 2017/0236731 A1 Aug. 17, 2017

Related U.S. Application Data

(60) Provisional application No. 62/294,621, filed on Feb. 12, 2016.

(51) Int. Cl.
| | |
|---|---|
| *C23C 16/00* | (2006.01) |
| *H01L 21/326* | (2006.01) |
| *H01L 21/67* | (2006.01) |
| *H01J 37/32* | (2006.01) |
| *H01L 21/3065* | (2006.01) |
| *H01L 21/311* | (2006.01) |
| *H01L 21/3213* | (2006.01) |

(52) U.S. Cl.
CPC ...... *H01L 21/67069* (2013.01); *H01J 37/321* (2013.01); *H01J 37/3211* (2013.01); *H01J 37/32155* (2013.01); *H01J 37/32449* (2013.01); *H01J 37/32816* (2013.01); *H01L 21/3065* (2013.01); *H01L 21/31116* (2013.01); *H01L 21/32137* (2013.01); *H01J 2237/334* (2013.01)

(58) Field of Classification Search
CPC ............. H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 5,522,934 A | * | 6/1996 | Suzuki ........... | C23C 16/455 118/723 AN |
| 5,556,549 A | * | 9/1996 | Patrick ........... | H01J 37/32082 118/712 |
| 5,990,017 A | * | 11/1999 | Collins .......... | H01L 21/31116 216/67 |

(Continued)

*Primary Examiner* — Luz L Alejandro Mulero

(57) ABSTRACT

A method for selectively etching one exposed material of a substrate relative to another exposed material of the substrate includes a) arranging the substrate in a processing chamber; b) setting a chamber pressure; c) setting an RF frequency and an RF power for RF plasma; d) supplying a plasma gas mixture to the processing chamber; e) striking the RF plasma in the processing chamber in one of an electric mode (E-mode) and a magnetic mode (H-mode); and f) during plasma processing of the substrate, changing at least one of the chamber pressure, the RF frequency, the RF power and the plasma gas mixture to switch from the one of the E-mode and the H-mode to the other of the E-mode and the H-mode.

15 Claims, 5 Drawing Sheets

(56) References Cited

U.S. PATENT DOCUMENTS

| | | | |
|---|---|---|---|
| 2003/0200929 A1* | 10/2003 | Otsuki | C23C 16/4404 |
| | | | 118/723 R |
| 2013/0193848 A1* | 8/2013 | Biloiu | H01J 37/3211 |
| | | | 315/111.41 |
| 2017/0032982 A1 | 2/2017 | Drewery et al. | |
| 2017/0200586 A1 | 7/2017 | Treadwell et al. | |

* cited by examiner

SYSTEMS AND METHODS FOR SELECTIVELY ETCHING FILM

CROSS-REFERENCE TO RELATED APPLICATIONS

This application claims the benefit of U.S. Provisional Application No. 62/294,621, filed on Feb. 12, 2016. The entire disclosure of the application referenced above is incorporated herein by reference.

FIELD

The present disclosure relates to substrate processing systems, and more particularly to systems and methods for selectively etching film.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. Examples of substrate processing systems for etching include transformer coupled plasma (TCP), inductive coupled plasma (ICP) and capacitively coupled plasma (CCP) systems.

During processing, the substrate is arranged on the substrate support. Different gas mixtures may be introduced into the processing chamber and radio frequency (RF) plasma may be used to activate chemical reactions. In some semiconductor manufacturing processes, several types of film may be exposed during an etching step. Normally, the etching process etches the various types of film at the same or similar etching rates.

Some semiconductor manufacturing processes may require one type of film on a substrate to be etched more than other types of film on the substrate. This type of etching is called selective etching since the etching process etches one film with little or no removal or damage to one or more other types of film. Highly selective etching is very desirable for some steps of the semiconductor manufacturing process. Examples of film that may need to be etched selectively include silicon nitride (SiN), polysilicon, pure silicon and silicon dioxide ($SiO_2$).

SUMMARY

A method for etching a substrate includes a) arranging the substrate in a processing chamber; b) setting a chamber pressure; c) setting an RF frequency and an RF power for RF plasma; d) supplying a plasma gas mixture to the processing chamber; e) striking the RF plasma in the processing chamber in one of an electric mode (E-mode) and a magnetic mode (H-mode); and f) during plasma processing of the substrate, changing at least one of the chamber pressure, the RF frequency, the RF power and the plasma gas mixture to switch from the one of the E-mode and the H-mode to the other of the E-mode and the H-mode.

In other features, the method includes g) during plasma processing of the substrate, changing at least one of the chamber pressure, the RF frequency, the RF power and the plasma gas mixture to switch to from the other of the E-mode and the H-mode to the one of the E-mode and the H-mode.

In other features, the plasma gas mixture includes N gases, and wherein a flow rate of at least one of the N gases is changed to switch to the other of the E-mode and the H-mode, where N is an integer greater than zero.

In other features, changing the plasma gas mixture includes adding or removing a gas species from the plasma gas mixture to switch to the other of the E-mode and the H-mode.

In other features, the chamber pressure is at least one of increased or decreased to switch to the other of the E-mode and the H-mode.

In other features, the RF power is at least one of increased or decreased to switch to the other of the E-mode and the H-mode.

In other features, the RF frequency is at least one of increased or decreased to switch to the other of the E-mode and the H-mode.

In other features, the method includes performing f) a predetermined period after e). The predetermined period corresponds to an estimated time for breakthrough of a layer of the substrate.

In other features, the method includes supplying the RF power using first and second coils arranged around the processing chamber; and varying at least one of the RF power and the RF frequency supplied to at least one of the first and second coils during f).

In other features, the RF plasma includes inductively coupled plasma.

A substrate processing system for etching a substrate includes a processing chamber including a substrate support. A gas delivery system supplies a plasma gas mixture to the processing chamber. An RF generator to supply RF power at an RF frequency to generate RF plasma. A controller in communication with the gas delivery system and the RF generator is configured to strike the RF plasma in the processing chamber in one of an electric mode (E-mode) and a magnetic mode (H-mode); and during plasma processing of the substrate, change at least one of a chamber pressure, the RF frequency, the RF power and the plasma gas mixture to switch from the one of the E-mode and the H-mode to the other of the E-mode and the H-mode.

In other features, the controller is further configured to, during plasma processing of the substrate, change at least one of the chamber pressure, the RF frequency, the RF power and the plasma gas mixture to switch from the other of the E-mode and the H-mode to the one of the E-mode and the H-mode.

In other features, the plasma gas mixture includes N gases, wherein N is an integer greater than zero and wherein the controller is further configured to change a flow rate of at least one of the N gases to switch to the other of the E-mode and the H-mode.

In other features, changing the plasma gas mixture includes adding or removing a gas species from the plasma gas mixture to switch to the other of the E-mode and the H-mode.

In other features, the controller is further configured to at least one of increase or decrease the chamber pressure to switch to the other of the E-mode and the H-mode.

In other features, the controller is further configured to at least one of increase or decrease the RF power to switch to the other of the E-mode and the H-mode.

In other features, the controller is further configured to at least one of increase or decrease the RF frequency to switch to the other of the E-mode and the H-mode.

In other features, the controller is further configured to switch from the one of the E-mode and the H-mode to the other of the E-mode and the H-mode a Predetermined period after striking the RF plasma.

In other features, the predetermined period corresponds to an estimated time for breakthrough of a layer of the substrate.

In other features, the controller is further configured to supply the RF power using first and second coils arranged around the processing chamber; and vary at least one of the RF power and the RF frequency supplied to at least one of the first and second coils to switch from the one of the E-mode and the H-mode to the other of the E-mode and the H-mode.

In other features, the RF plasma includes inductively coupled plasma.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 8-10 illustrate variation in RF power, pressure and/or gas chemistry during selective etching to transition between inductive and magnetic coupling modes.

In the drawings, reference numbers may be reused to identify similar and/or identical elements.

DETAILED DESCRIPTION

Current etching technology uses low pressure transformer coupled plasma (TCP), inductive coupled plasma (ICP) and capacitively coupled plasma (CCP) sources. The TCP and ICP plasma sources are operated at low pressures (<0.5 Torr) to achieve good directionality. To date these technologies have been limited in their ability to provide plasma conditions required for obtaining highly selective etching of different semiconductor films such as SiN, polysilicon, pure silicon and silicon dioxide ($SiO_2$).

The present disclosure overcomes these problems and is able to provide the necessary plasma properties by using a high density plasma source, operating at a high pressure (>0.5 Torr), and/or controlling the ratio of electric (E-mode) to magnetic (H-mode) RF coupling to the plasma by varying ICP power, RF frequency, chamber pressure, gas chemistry, etc.

As the ratio of E-mode to H-mode coupling is varied, the plasma properties, including electron temperature and electron density are optimized to obtain the required chemistry, radicals and atoms for highly selective etching. Operating close to the E to H mode transition can also allow selective generation of radicals for etching as compared to passivation. In some examples, transitioning from E to H mode for etch selectivity or etch vs passivation may be a continuously transitioning process that is accomplished by level-to-level pulsing of the ICP power. In some examples, the transition between modes occurs without extinguishing the plasma. Higher nitride/oxide selectivity is possible in H mode as compared to E mode.

Figure 1:
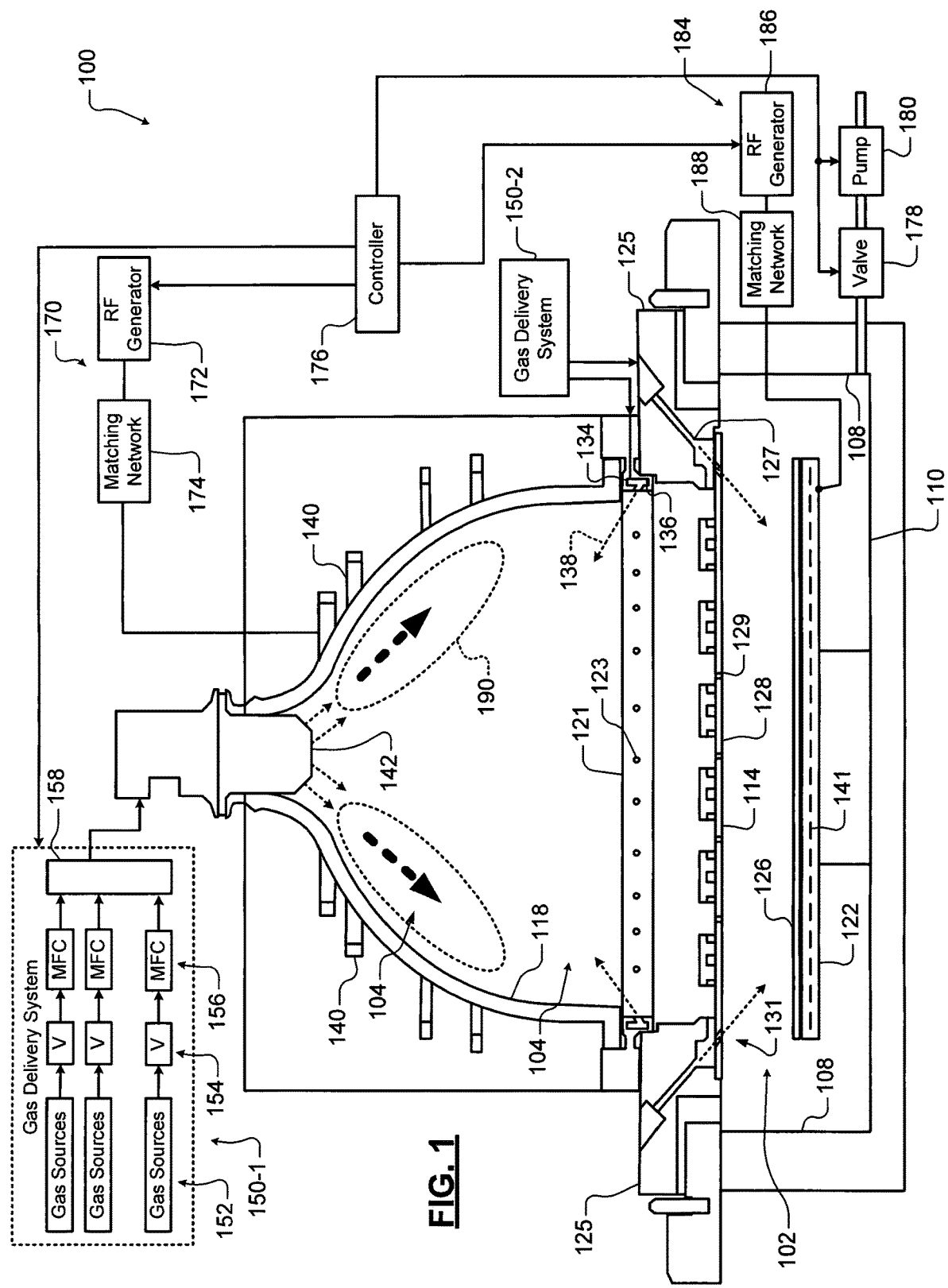
FIG. 1 is a functional block diagram and cross-sectional view of a substrate processing chamber according to the present disclosure.

Referring now to FIG. 1, an example of a substrate processing chamber 100 for selectively etching of film on a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 141, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the spaced holes 129 have a diameter in a range from 1-3 cm (~0.4" to 1.18") and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels (in addition to or instead of etch gas from the gas injector 142).

Suitable gas delivery systems are shown and described in commonly assigned U.S. patent application Ser. No. 14/945,680, entitled "Gas Delivery System" and filed on Nov. 19, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing Chamber Including Multiple Gas Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

In one example, an ICP source is constructed with the dome made of dielectric and having a diameter of about 10 to 18 inches. In this example, the plasma source is driven by RF power at a frequency of 13.56 Mhz (or another suitable frequency) supplied to large coils surrounding the full diameter of the dome. The large coils provide high inductance required for generating high voltages, which create electric coupling to the plasma. The large diameter coils also distribute the energy over a larger volume, which results in lower plasma density and delays the transition to the H-mode. In some examples, the chemistry and pressure are selected to allow the source to operate in the E-mode at medium power and transition to the H-mode at higher power.

Operating at higher pressures, in the 0.5 to 5 Torr range with low electron temperatures provides the conditions necessary for higher power operation in the E-mode of the ICP source. This provides the capability of adjusting the ratio of electric and magnetic coupling as the source transitions from the E-mode to H-mode with increased RF power. By controlling the ratio of electric and magnetic coupling to the plasma, the plasma properties including electron temperature and electron density are optimized to obtain the required chemistry, radicals and atoms for highly selective etching or allow selective generation of radicals for etch vs passivation.

In one example, the frequency of the RF power is varied during etching to control the ratio of electric and magnetic coupling.

Figure 2:
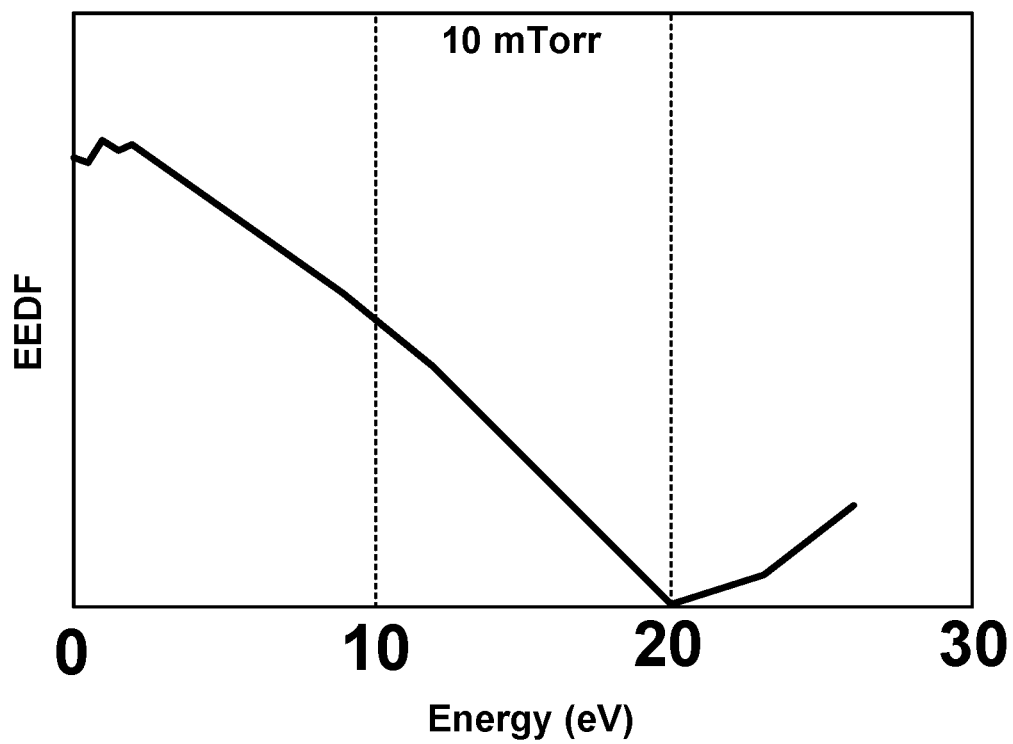
FIGS. 2-3 are graphs illustrating an electron energy distribution function (EEDF) as a function of energy for different chamber pressures.
Figure 3:
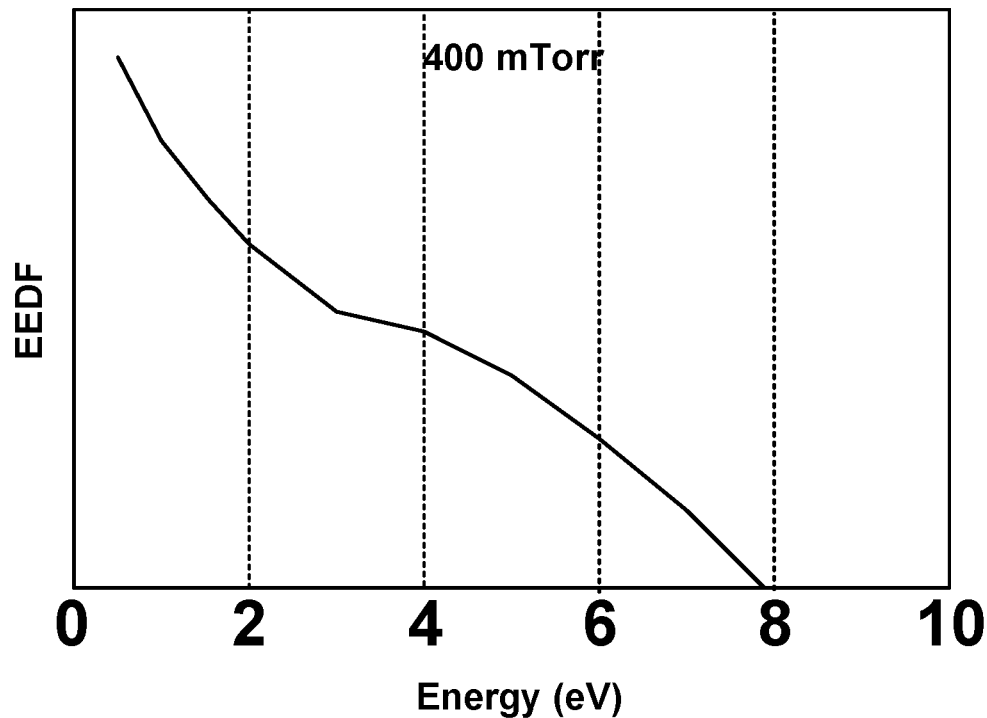

Referring now to FIGS. 2 and 3, graphs illustrate the reduction in electron energy distribution function (EEDF) as the pressure is increased.

Figure 4:
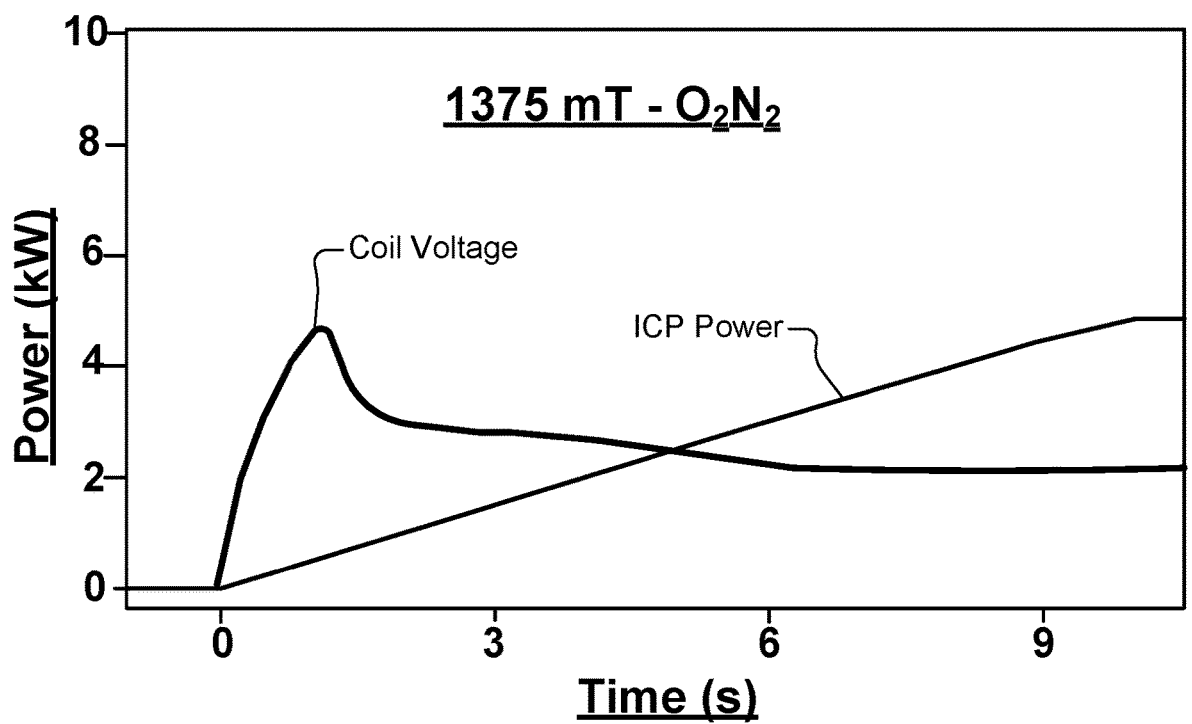
FIGS. 4-6 are graphs illustrating ICP power and coil voltage as a function of time for different pressures and gas chemistries.
Figure 5:
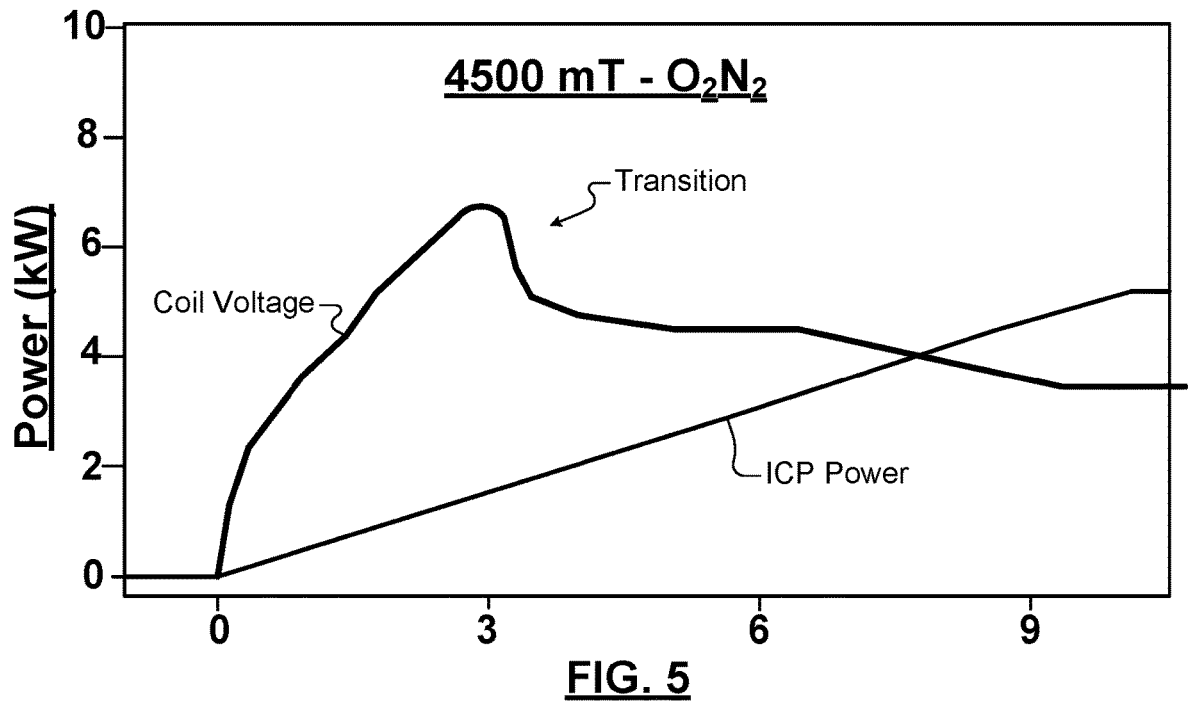

Referring now to FIGS. 4 and 5, graphs illustrate the effect of chemistry on the transition from E-mode to H-mode. In FIG. 4, the gas chemistry includes $O_2N_2$ at 1375 mTorr. The ICP power is increased from 0 kW at 0 s to about 4300 kW at 9 s. In FIG. 5, the gas chemistry includes $O_2N_2$ at 4500 mTorr. The ICP power is increased from 0 kW at 0 s to about 4300 kW at 9 s. As can be seen in FIGS. 4-5, the pressure for the same gas chemistry can be varied to control the ratio of electric and magnetic coupling. Increasing the pressure shifts the source to more capacitive or E-field coupling and reducing the pressure shifts the source operation to more magnetic coupling.

Figure 6:
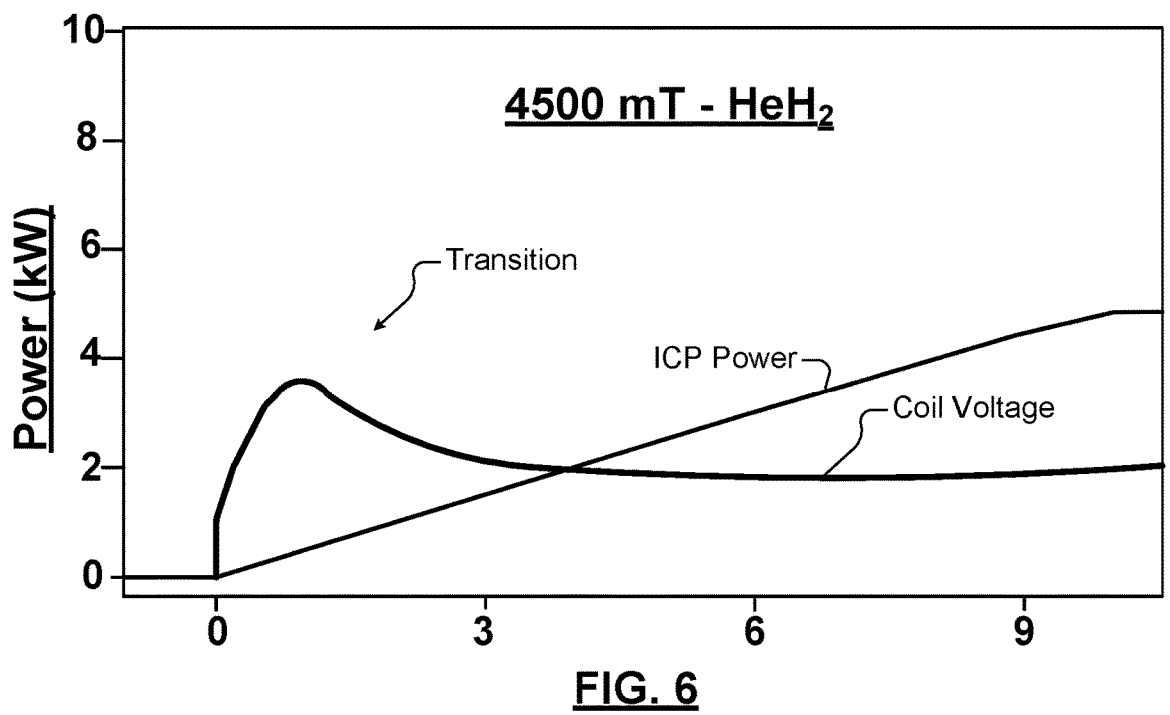

Referring now to FIGS. 5-6, the gas chemistry is changed from $O_2N_2$ at 4500 mTorr in FIG. 5 to $HeH_2$ at 4500 mTorr in FIG. 6. Therefore, the gas chemistry can also be varied to control the ratio of E-mode and H-mode coupling. Addition changes can be made by adding a high electron affinity gas such as argon (Ar) to the gas chemistry to help transition to H-mode coupling or adding an electronegative gas such as NF3 to move to more E-mode coupling.

Figure 7B:
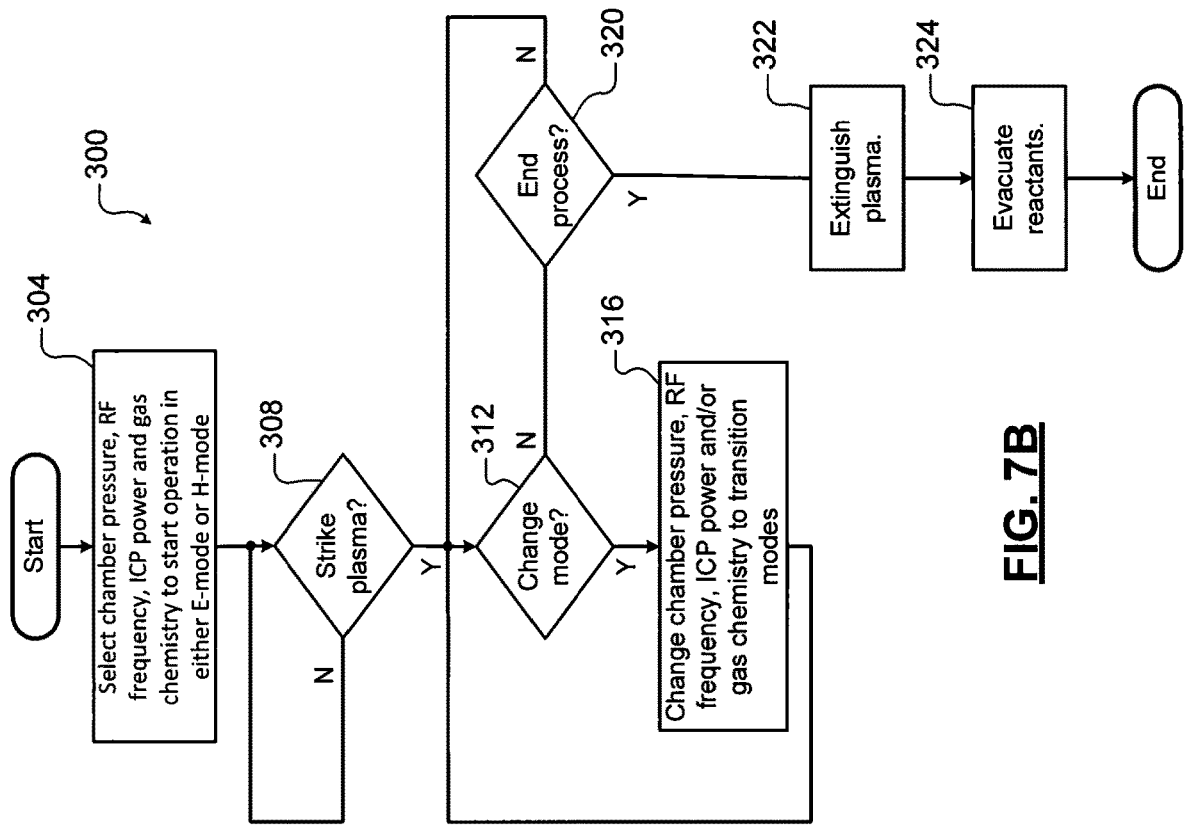
FIGS. 7A-7B are flowcharts illustrating methods for operating a substrate processing chamber according to the present disclosure.
Figure 7A:
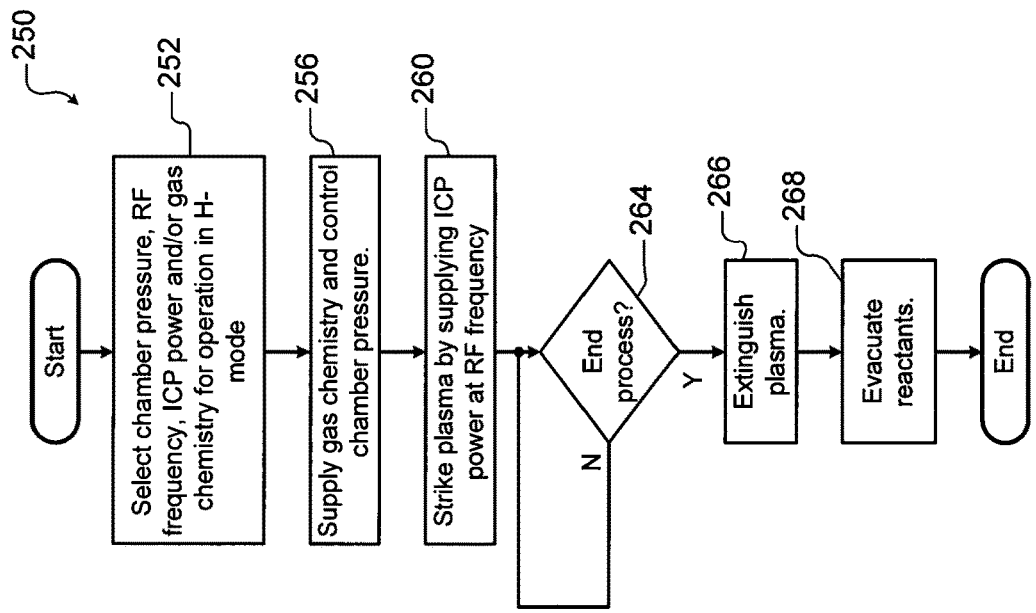

Referring now to FIGS. 7A and 7B, a method 250 for operating a substrate processing chamber to selectively etch film on a substrate is shown. At 252, a chamber pressure, RF frequency, ICP power and/or gas chemistry is selected for operation in the H-mode. At 256, the gas chemistry is supplied to the substrate processing chamber and the chamber pressure is controlled to a predetermined value. In some examples, the pressure is controlled to the high pressure range described above. At 260, the plasma is struck by supplying the ICP power at an RF frequency. At 264, the method determines whether the process period is over. If 264 is true, the plasma is extinguished at 266 and the reactants are evacuated from the chamber at 268.

In FIG. 7B, a method 300 for operating a substrate processing chamber to selectively etch film on a substrate is shown. In this example, the plasma is controlled to transition one or more times between the E-mode and the H-mode. At 304, chamber pressure, RF frequency, ICP power and/or gas chemistry are selected to start operation in either the E-mode or H-mode. At 308, the plasma is struck. At 312, the method determines whether the current mode should be changed. The mode may be changed one or more times based upon an event occurring (such as breakthrough), after a predetermined period or based on other on other criteria. If 312 is true, the chamber pressure, RF frequency, ICP power and/or gas chemistry are adjusted to transition from one mode to another mode or from near a mode transition to an operating point away from the mode transition. If 312 is false, the method determines whether the process period is over at 320. When 320 is true, the method extinguishes the plasma at 322 and evacuates reactants from the chamber at 324.

Referring now to FIGS. 8 and 9, the control parameters may be pulsed from one operating point to another operating point one or more times during selective etching to control the ratio of E-mode and H-mode coupling. Alternately, the control parameters can be gradually changed from one operating point to another. For example, the pressure, RF power, RF frequency or gas chemistry can be changed in a gradual or linear fashion from one operating point to another.

For example in FIG. 8, the pressure is pulsed from a first pressure $P_1$ to a second pressure $P_2$ or vice versa. In this example, the transition pressure $P_T$ lies between the first pressure $P_1$ and the second pressure $P_2$ for the gas chemistry, ICP power and RF frequency being used. While the process begins with the first pressure $P^1$, the process may be initiated at or near the transition pressure $P_T$ or at the second pressure $P_2$.

In FIG. 9, pulsing of RF power one or more times during etching may also be used to control the ratio of E-mode and H-mode coupling. The power is pulsed from a first power level $P_{RF1}$ to a second power level $P_{RF2}$. In this example, the transition power lies between the first power level $P_{RF1}$ and the second power level $P_{RF2}$ for the pressure, gas chemistry, and ICP power being used. While the process begins with the first power level $P_{RF1}$, the process may be initiated at or near the transition power or at the second power level $P_{RF2}$. The first power level $P_{RF1}$ may be zero or non-zero power levels. As can be appreciated, the duty cycle can be varied by changing the duration of periods $t_{low}$ and $t_{high}$. In some examples, the RF power level may be pulsed on and off and additional magnetic coupling occurs as the RF on time is increased.

Referring now to FIG. 10, the gas chemistry may also be adjusted by altering, starting or stopping the flow of one or more electronegative gas species and/or high electron affinity gas species. For example, the flow of electronegative gas species is adjusted one or more times during etching from a second flow rate $F_{2EN}$ to a first flow rate $F_{1EN}$ or vice versa. The first flow rate $F_{1EN}$ may be zero or non-zero flow rate. For example, the flow of high electron affinity gas species is adjusted one or more times during etching from a second flow rate $F_{2EA}$ to a first flow rate $F_{1EA}$ or vice versa. The first flow rate $F_{1EA}$ may be zero or non-zero flow rate. Flows of both electronegative gas species and high electron affinity gas species may be adjusted during the same etching process.

In another example, inductive coupling is increased during a first period to obtain higher plasma density and etch rates and then the process is optimized for selectivity in a subsequent period before the process breaks through a top layer that is being etched.

In another example, a smaller coil is used at a higher frequency in the first example. For example, the inductive coils 140 described above may include an upper coil and a lower coil. For example for a semi-hemispherical chamber with a diameter of 12", the lower coil may have an inner diameter of 14", 2 turns and ¼" diameter round cross-section and the upper coil may have an inner diameter of 6", two turns and a ¼" diameter round cross-section. The upper and lower coils may be supplied RF power at 13.56 MHz or another suitable frequency.

In some examples, the diameter of the upper coil may be adjusted to an inner diameter of 3", 2 turns and may be supplied RF power at 27 MHz. In some examples, the diameter of the upper coil may be adjusted to an inner diameter of 6", 1 turn and may be supplied RF power at 27 MHz. In some examples, the cross-section of the upper and/or lower coils may be a shape other than round such as elliptical, square, rectangular, etc. In another example, a separate capacitive plate is added to one or both the upper and lower coils to provide independent localized control of the capacitive and magnetic coupling.

In another example, RF power at multiple frequencies is applied to one or both of the upper and lower coils to control the ratio of electric and magnetic coupling.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for etching a substrate, comprising:
 a processing chamber including an upper chamber region and a lower chamber region including a substrate support;
 a gas distribution device disposed between the upper chamber region and the lower chamber region;
 a gas delivery system to supply a plasma gas mixture to the processing chamber;
 an inductive coil arranged around the upper chamber region;
 an RF generator to supply RF power at an RF frequency via the inductive coil to generate RF plasma in the upper chamber region characterized by a plurality of ratios of electric mode (E-mode) to magnetic mode (H-mode) coupling, wherein a first ratio of the plurality of ratios corresponds to an E-mode and a second ratio of the plurality of ratios corresponds to a H-mode; and
 a controller in communication with the gas delivery system and the RF generator and configured to:

strike the RF plasma in the upper chamber region in one of the E-mode and the H-mode;

during plasma processing of the substrate, change at least one of a chamber pressure, the RF frequency, the RF power, and the plasma gas mixture to transition between the first ratio and the second ratio a plurality of times; and switch from one of the E-mode and the H-mode to the other one of the E-mode and the H-mode a predetermined period after striking the RF plasma, wherein the predetermined period corresponds to an estimated time for breakthrough of a layer of the substrate.

2. The substrate processing system of claim 1, wherein the plasma gas mixture includes N gases, wherein N is an integer greater than zero and wherein the controller is further configured to adjust, a plurality of times, a flow rate of at least one of the N gases between a first flow rate and a second flow rate to transition between the first ratio and the second ratio.

3. The substrate processing system of claim 1, wherein changing the plasma gas mixture includes adding or removing a gas species from the plasma gas mixture to switch to the other one of the E-mode and the H-mode.

4. The substrate processing system of claim 1, wherein the controller is further configured to at least one of increase or decrease the chamber pressure to switch to the other one of the E-mode and the H-mode.

5. The substrate processing system of claim 1, wherein the controller is further configured to at least one of increase or decrease the RF power to switch to the other one of the E-mode and the H-mode.

6. The substrate processing system of claim 1, wherein the controller is further configured to at least one of increase or decrease the RF frequency to switch to the other one of the E-mode and the H-mode.

7. The substrate processing system of claim 1, the controller is further configured to:

supply the RF power using the inductive coil, wherein the inductive coil includes first and second coils arranged around the upper chamber region, the first coil characterized by a first diameter and the second coil characterized by a second diameter, wherein the second diameter is greater than the first diameter; and vary at least one of the RF power and the RF frequency supplied to at least one of the first and second coils to transition between the first ratio and the second ratio.

8. The substrate processing system of claim 1, wherein the RF plasma includes inductively coupled plasma.

9. The substrate processing system of claim 1, wherein upper chamber region is defined by an inner surface of a dome and the inductive coil is arranged around an outer portion of the dome.

10. The substrate processing system of claim 1, wherein the gas distribution device comprises a showerhead.

11. The substrate processing system of claim 1, wherein:
the plasma gas mixture includes a plurality of gases; and
the controller is configured to adjust, a plurality of times, a flow rate of at least one of the plurality of gases between a first flow rate and a second flow rate to switch from the one of the E-mode and the H-mode to the other one of the E-mode and the H-mode the predetermined period after striking the RF plasma.

12. The substrate processing system of claim 1, wherein changing the plasma gas mixture includes adding or removing a gas species from the plasma gas mixture to switch from the one of the E-mode and the H-mode to the other one of the E-mode and the H-mode the predetermined period after striking the RF plasma.

13. The substrate processing system of claim 1, wherein the controller is configured to change the plasma gas mixture by adjusting flow of one or more electronegative gas species and flow of one or more electron affinity gas species.

14. A substrate processing system for etching a substrate, comprising:

a processing chamber including an upper chamber region and a lower chamber region including a substrate support;

a gas distribution device disposed between the upper chamber region and the lower chamber region;

a gas delivery system to supply a plasma gas mixture to the processing chamber;

an inductive coil arranged around the upper chamber region;

an RF generator to supply RF power at an RF frequency via the inductive coil to generate RF plasma in the upper chamber region characterized by a plurality of ratios of electric mode (E-mode) to magnetic mode (H-mode) coupling, wherein a first ratio of the plurality of ratios corresponds to an E-mode and a second ratio of the plurality of ratios corresponds to a H-mode; and a controller in communication with the gas delivery system and the RF generator and configured to:
strike the RF plasma in the upper chamber region in one of the E-mode and the H-mode; and
during plasma processing of the substrate, change the plasma gas mixture to transition between the first ratio and the second ratio a plurality of times.

15. A substrate processing system of claim 14, wherein changing the plasma gas mixture to transition between the first ratio and the second ratio a plurality of times includes adding or removing a gas species from the plasma gas mixture to switch from one of the E-mode and the H-mode to the other one of the E-mode and the H-mode.

* * * * *